(12) United States Patent
Oka et al.

(10) Patent No.: US 9,484,514 B2
(45) Date of Patent: Nov. 1, 2016

(54) LIGHT-EMITTING DEVICE

(71) Applicant: NICHIA CORPORATION, Anan-shi, Tokushima (JP)

(72) Inventors: Yuta Oka, Tokushima (JP); Tatsuya Yanamoto, Anan (JP)

(73) Assignee: NICHIA CORPORATION, Anan-Shi (JP)

(*) Notice: Subject to any disclaimer, the term of this patent is extended or adjusted under 35 U.S.C. 154(b) by 0 days.

(21) Appl. No.: 13/953,859

(22) Filed: Jul. 30, 2013

(65) Prior Publication Data

US 2014/0034973 A1 Feb. 6, 2014

(30) Foreign Application Priority Data

Jul. 31, 2012 (JP) ................. 2012-170239

(51) Int. Cl.
| | | |
|---|---|---|
| *H01L 33/00* | (2010.01) | |
| *H01L 33/64* | (2010.01) | |
| *H01L 33/62* | (2010.01) | |
| *F21K 99/00* | (2016.01) | |
| *H05K 3/28* | (2006.01) | |
| *H01L 25/075* | (2006.01) | |
| *F21Y 101/02* | (2006.01) | |
| *F21Y 103/00* | (2016.01) | |
| *H05K 1/02* | (2006.01) | |

(52) U.S. Cl.
CPC ............. *H01L 33/64* (2013.01); *F21K 9/00* (2013.01); *H01L 33/62* (2013.01); *H05K 1/0295* (2013.01); *H05K 1/0296* (2013.01); *H05K 3/28* (2013.01); *F21Y 2101/02* (2013.01); *F21Y 2103/003* (2013.01); *H01L 25/0753* (2013.01); *H01L 2224/48091* (2013.01); *H01L 2224/8592* (2013.01); *H05K 1/0203* (2013.01); *H05K 3/284* (2013.01); *H05K 2201/0187* (2013.01); *H05K 2201/09954* (2013.01); *H05K 2201/10106* (2013.01); *H05K 2201/2054* (2013.01); *H05K 2203/063* (2013.01)

(58) Field of Classification Search
CPC . H01L 33/62; H01L 27/153; H01L 25/0753; H01L 27/156; H01L 2224/48247; H01L 2224/48137; H01L 33/64; F21K 9/00; H05K 1/0203; H05K 1/0295; H05K 1/0296; H05K 3/28
USPC ............................................ 257/88
See application file for complete search history.

(56) References Cited

U.S. PATENT DOCUMENTS

| 2003/0160255 A1* | 8/2003 | Taninaka et al. ........... 257/88 |
| 2009/0272991 A1* | 11/2009 | Lee ................... H01L 25/0753 257/91 |

(Continued)

FOREIGN PATENT DOCUMENTS

| JP | 2007-288200 A | 11/2007 |
| JP | 2011-009682 A | 1/2011 |
| JP | 2012-009582 A | 1/2012 |

*Primary Examiner* — Thien F Tran
(74) *Attorney, Agent, or Firm* — Squire Patton Boggs (US) LLP

(57) ABSTRACT

A light-emitting device including: a base; light-emitting elements arranged on the base at intervals in an array along a predetermined direction of the base; and conductive-wiring parts formed on first and second sides of the array of the light-emitting elements on the base. The conductive-wiring parts are discretely formed along the predetermined direction of the base, each of the conductive-wiring parts relaying electrical connection between the light-emitting elements, and the number of the conductive-wiring parts arranged per light-emitting element on each of the first and second sides of the array of the light-emitting elements is two or more.

22 Claims, 7 Drawing Sheets

(56) References Cited

U.S. PATENT DOCUMENTS

2011/0199768 A1* 8/2011 Kuo et al. ................ 362/249.02
2011/0316009 A1* 12/2011 Fukasawa ...................... 257/88
2013/0208026 A1* 8/2013 Suzuki ................... H01L 33/36
                                                       345/690

* cited by examiner

LIGHT-EMITTING DEVICE

CROSS-REFERENCE TO RELATED APPLICATION

This application claims the foreign priority benefit under 35 U.S.C. §119 of Japanese Patent Application No. 2012-170239, filed on Jul. 31, 2012, the entire contents of which are incorporated herein by reference.

BACKGROUND OF THE INVENTION

1. Field of the Invention

The present invention relates to a light-emitting device using one or more light-emitting elements such as light-emitting diodes (LEDs).

2. Description of the Related Art

It is generally known that the light-emitting devices using light-emitting elements are small in size and superior in power efficiency, and emit light having bright colors. Since the light-emitting elements used in the light-emitting devices are semiconductor elements, the light-emitting elements are unlikely to cause troubles like the bulb blow-out, have superior initial driving characteristics, and are resistant to vibration, repetition of turning on and off, and the like. Because of the above superior properties, the light-emitting devices using the light-emitting elements are currently used as various types of light sources, where the light-emitting elements are, for example, light-emitting diodes (LEDs) or laser diodes (LDs).

The light-emitting devices are each constituted by one or more light-emitting elements, a base, and an encapsulation member, where the one or more light-emitting elements are arranged on the base, the base has conductive wiring for electric connection to the one or more light-emitting elements, and the encapsulation member covers the one or more light-emitting elements on the base. In some types of light-emitting devices such as the light-emitting devices having a surface mount-type COB (chip on board) structure, a resin frame is formed around the periphery of the light-emitting element(s).

In a conventionally proposed light-emitting device having a surface mount-type COB structure as above, multiple light-emitting elements are arranged in the length direction on an elongate base in order to use the light-emitting device in a backlight unit of an edge light type, an LED lamp of a straight tube type, or the like. (See, for example, Japanese Patent Laid-open No. 2012-009582, which is hereinafter referred to as JP2012-009582A.) JP2012-009582A proposes a light-emission module having light-emitting elements which are arranged in a recessed region along the length direction of a metal base and interconnected through conductor patterns.

SUMMARY OF THE INVENTION

In order to achieve the above object, a light-emitting device according to the present embodiment is provided. The light-emitting device according to the present embodiment includes: a base; light-emitting elements arranged on the base at intervals in an array along a predetermined direction of the base; and conductive-wiring parts formed on first and second sides of the array of the light-emitting elements on the base. The conductive-wiring parts are discretely formed along the predetermined direction of the base, each of the conductive wiring parts relaying electrical connection between the light-emitting elements, and the number of the conductive-wiring parts arranged per light-emitting element on each of the first and second sides of the array of the light-emitting elements is two or more.

In the light-emitting device having the above structure, the ones of the conductive-wiring parts, to which electrodes of the light-emitting elements can be connected, are discretely arranged on each of the first and second sides of the array of the light-emitting elements, and the number of the ones of the conductive-wiring parts arranged per light-emitting element on each of the first and second sides of the array of the light-emitting elements is two or more. Therefore, when the light-emitting elements are mounted on the base, two or more of the conductive-wiring parts can exist between adjacent ones of the light-emitting elements, and the two or more of the conductive-wiring parts can be freely used for connection between the light-emitting elements. Thus, the light-emitting elements can be connected in a desired manner (e.g., a series connection, a parallel connection, or a series-parallel connection) by using the conductive-wiring parts.

For example, the light-emitting elements may be connected by using the conductive-wiring parts in the following manner. That is, the pair of electrodes which each of the light-emitting elements has are respectively connected by wires to one of the conductive-wiring parts formed on the first side of the array of the light-emitting elements and one of the conductive-wiring parts formed on the second side of the array of the light-emitting elements, and each of the conductive-wiring parts which is formed on one of the first and second sides of the array of the light-emitting elements and connected to one electrode of a first one of the light-emitting elements is connected by wires through one or more of the conductive-wiring parts formed on the one of the first and second sides to one of a pair of electrodes of a second one of the light-emitting elements adjacent to the first one of the light-emitting elements.

In addition, in the case where the light-emitting elements are connected by using the conductive-wiring parts in such a manner that the above-mentioned electrode of the first one of the light-emitting elements and the above-mentioned electrode of the second one of the light-emitting elements have polarities opposite to each other, the light-emitting elements are connected in series.

Alternatively, in the case where the light-emitting elements are connected by using the conductive-wiring parts in such a manner that the aforementioned electrode of the first one of the light-emitting elements and the aforementioned electrode of the second one of the light-emitting elements have an identical polarity, the light-emitting elements are connected in parallel.

Further alternatively, the light-emitting elements may be connected in a series-parallel connection by using the conductive-wiring parts, where the light-emitting elements are grouped into light-emitting element groups, adjacent ones of the light-emitting element groups are connected in series through one or more of the conductive-wiring parts, and the aforementioned electrode of the first one of the light-emitting elements and the aforementioned electrode of the second one of the light-emitting elements have an identical polarity when the first one of the light-emitting elements and the second one of the light-emitting elements belong to an identical one of the light-emitting element groups. That is, the light-emitting elements in each of the light-emitting element groups are connected in parallel, and the light-emitting element groups are connected in series.

As described above, in the light-emitting device according to the present embodiment, the light-emitting elements can be easily connected in a desired manner (e.g., a series connection, a parallel connection, or a series-parallel connection) by using the conductive-wiring parts arranged on the first and second sides of the array of the light-emitting elements.

Preferably, the base is constituted by a first base part and a second base part, the first base part has an elongate shape and a groove formed in the length direction, the second base part is arranged in the groove, and the light-emitting elements are mounted on the upper surface of the second base part.

In the light-emitting device having the above structure, the base is constituted by the two regions, the region on which the light-emitting elements are mounted and the other region. Therefore, it is possible to form each of the above regions of an optimum material. For example, the second base part, on which the light-emitting elements are mounted, can be formed of a material which is superior in heat dissipation, and the first base part can be formed of a low-cost material.

In the light-emitting device according to the present embodiment, the first base part may be formed of, for example, glass epoxy resin or aluminum, and the second base part may be formed of, for example, glass epoxy resin or ceramic material.

In the light-emitting device according to the present embodiment, the cost of the light-emitting device can be suppressed in the case where at least one of the first and second base parts is formed of glass epoxy resin, compared with the case where both of the first and second base parts are formed of ceramic material. Further, the heat dissipation, heat resistance, optical resistance, and optical reflectivity of the light-emitting device can be improved in the case where the first base part is formed of aluminum and the second base part is formed of ceramic material, compared with the case where the first base part is formed of glass epoxy resin.

Preferably, in the light-emitting device according to the present embodiment, the groove of the first base part has a bottom surface and side wall surfaces, the bottom surface is realized by copper foil, the side wall surfaces of the groove are realized by opposed side surfaces of first and second elongate portions of the first base part which are arranged apart from each other on the copper foil, the first and second elongate portions are formed of glass epoxy resin, the second base part is formed of ceramic material, and the conductive-wiring parts are discretely formed in arrays along the length direction on the upper surfaces of the first and second elongate portions.

In the light-emitting device according to the present embodiment, the heat generated in the light-emitting elements can be transferred through the second base part formed of ceramic material and the bottom surface of the groove formed of copper foil, and be externally dissipated. Therefore, the second base part formed of ceramic material and the bottom surface of the groove formed of copper foil can further improve the performance in heat dissipation.

Preferably, in the light-emitting device according to the present embodiment, the bottom surface of the second base part is bonded through a metal film to the upper surface of the copper foil.

Further, in the light-emitting device having the above structure, the metal film is formed between the copper foil realizing the bottom surface of the groove and the ceramic material constituting the second base part. Therefore, the bonding of the identical type of materials can improve the adhesiveness between the second base part of the ceramic material and the bottom portion of the copper foil, and can further improve the performance in heat dissipation. For example, eutectic bonding or the like can be used for bonding the second base part and the copper foil through the metal film.

Since the light-emitting device according to the present invention includes the conductive-wiring parts which are discretely formed along the length direction of the base, the manner of connection of the light-emitting elements mounted on the base can be freely changed. Therefore, the versatility of the light-emitting device can be improved according to the present invention.

BRIEF DESCRIPTION OF THE DRAWINGS

FIG. 5A illustrates a step for producing a first base part, FIG. 5B illustrates a step for forming conductive-wiring parts, FIG. 5C illustrates a step for arranging a second base part, FIG. 5D illustrates a step for mounting light-emitting elements, FIG. 5E illustrates a step for wire bonding, FIG. 5F illustrates a step for forming optically-reflective resin covers, FIG. 5G illustrates a step for forming a first resin sealing cover, and FIG. 5H illustrates a step for forming a second resin sealing cover;

DETAILED DESCRIPTION OF THE INVENTION

Figure 1:
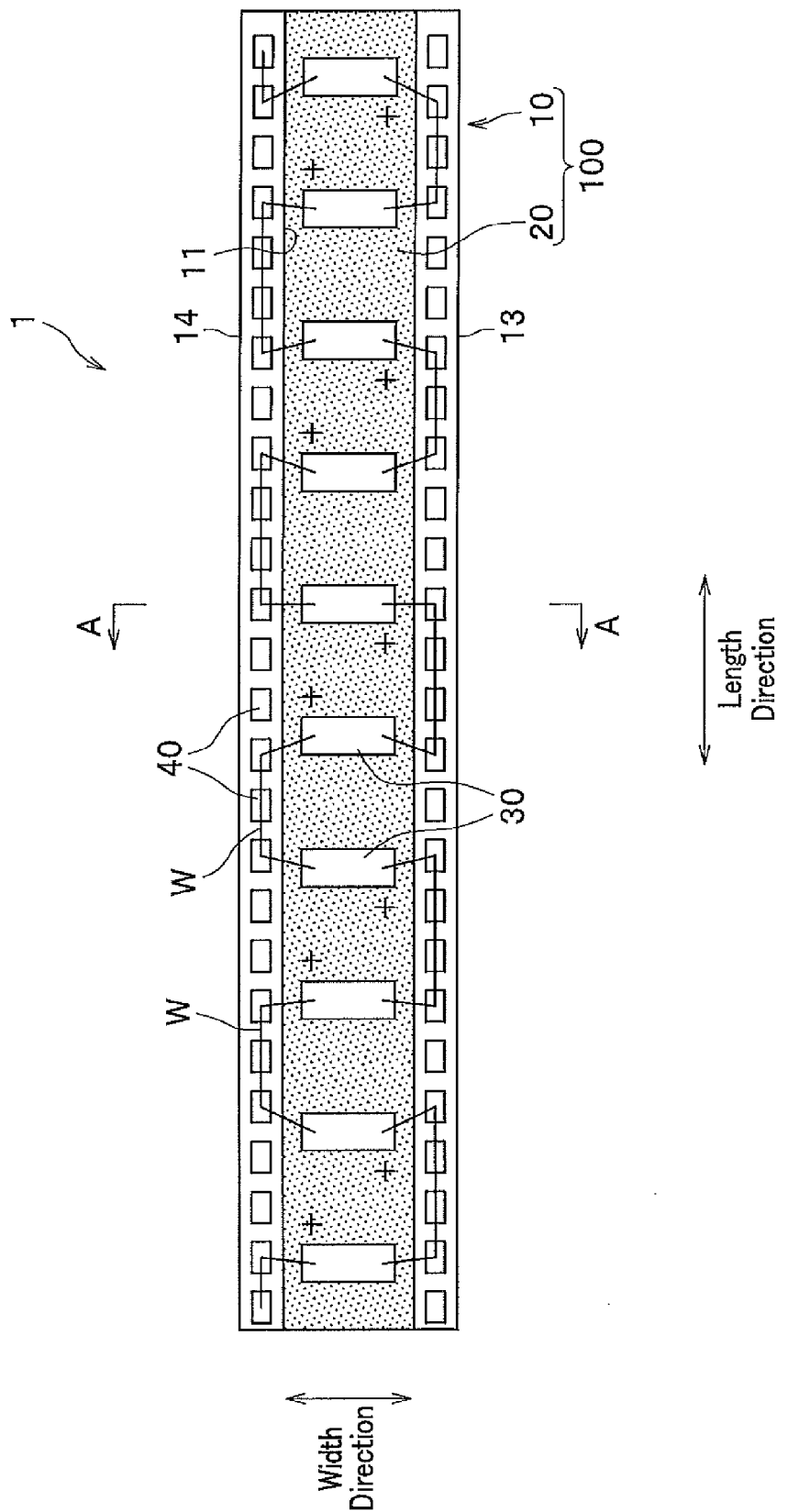
FIG. 1 is a top view schematically illustrating the entire structure of a light-emitting device according to an embodiment of the present invention (except for resin members) in the case where light-emitting elements are connected in series.

The light-emitting devices according to the embodiment of the present invention are explained below with reference to accompanying drawings. In the drawings referred to in the following explanations, the light-emitting devices according to the present invention are schematically illustrated, so that the dimensions of the respective constituents and the gaps between the respective constituents and the positional relationships between the respective constituents may be exaggerated, and illustration of part of the constituents may be omitted. In addition, identical or equivalent components or constituents are basically indicated by the same reference numbers, and identical explanations are not repeated unless necessary.

1. Structure of Light-Emitting Device

Figure 2:
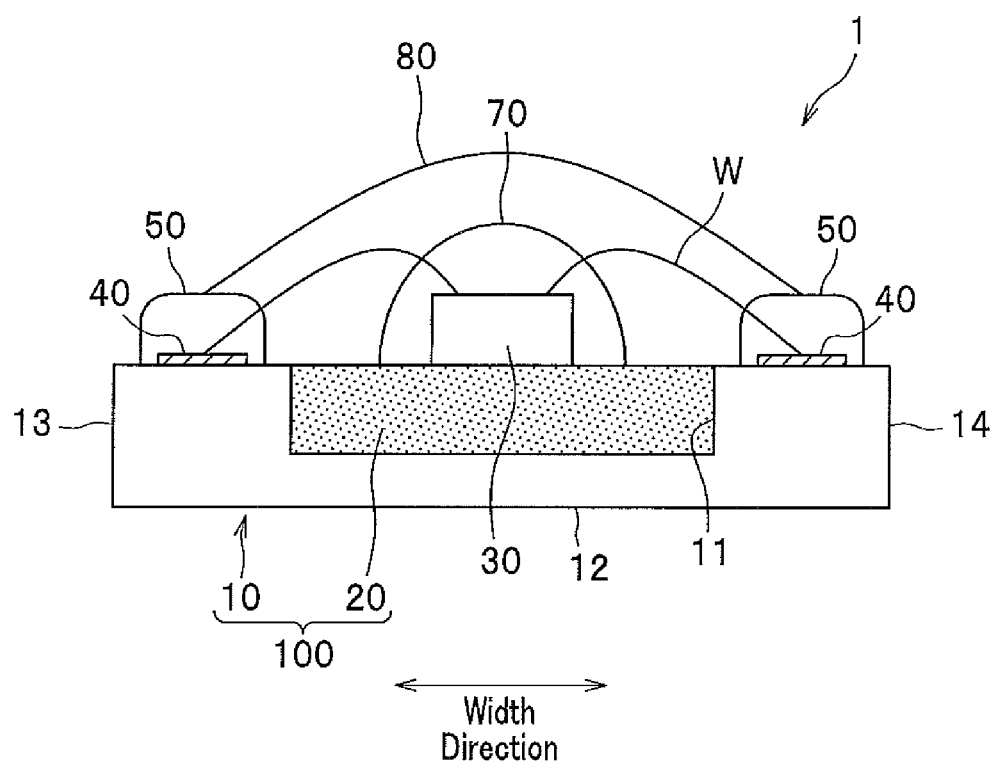
FIG. 2 is a cross-sectional view schematically illustrating the entire structure of the light-emitting device according to the embodiment of the present invention (except for the resin members) at the A-A cross section in FIG. 1.

The structure of the light-emitting device 1 according to the embodiment of the present invention is explained below with reference to FIGS. 1 and 2. The light-emitting device 1 is a device which can be used in an edge light-type backlight unit or a straight tube-type LED lamp. As illustrated in FIGS. 1 and 2, the light-emitting device 1 contains a first base part 10, a second base part 20, light-emitting elements 30, conductive-wiring parts 40, optically-reflective resin covers 50, a first resin sealing cover 70, and a second resin sealing cover 80. Further, for clear illustration, the optically-reflective resin covers 50, the first resin sealing cover 70, and the second resin sealing covers 80 (which are illustrated in FIG. 2) are not illustrated in FIG. 1.

The first and second base parts 10 and 20 are provided for arranging the other constituents of the light-emitting device 1. As illustrated in FIGS. 1 and 2, the first and second base parts 10 and 20 constitute a base 100. That is, the base 100 can be formed by arranging the second base part 20 on the first base part 10.

The first base part 10 is provided for arranging the second base part 20 as illustrated in FIG. 1. As illustrated in FIG. 1, the first base part 10 has an elongate shape in the top view, and a groove 11 is formed in the length direction of the first base part 10. The groove 11 has a constant depth through the entire length from one end to the opposite end. Because of the groove 11, the first base part 10 has a concave cross section as illustrated in FIG. 2. The second base part 20 is arranged in the groove 11 in the first base part 10 as illustrated in FIG. 1.

Specifically, as illustrated in FIG. 2, the first base part 10 is constituted by a bottom portion 12, a first elongate portion 13, and a second elongate portion 14. The first and second elongate portions 13 and 14 are arranged apart from each other on areas, near the opposite edges in the width direction, of the upper surface of the bottom portion 12. The bottom portion 12 and the first and second elongate portions 13 and 14 are integrally formed of an identical material. As illustrated in FIG. 1, the upper surface of the bottom portion 12 realizes the bottom surface of the groove 11, and the inner side surfaces of the first and second elongate portions 13 and 14 which are opposed to each other realize the side wall surfaces of the groove 11.

As illustrated in FIG. 1, the conductive-wiring parts 40 are discretely formed on the upper surfaces of the first and second elongate portions 13 and 14 along the length direction. In addition, the optically-reflective resin covers 50 are formed to have a convex cross-sectional shape so as to cover the conductive-wiring parts 40. The first base part 10 may be formed of, for example, glass epoxy resin or aluminum.

The second base part 20 is provided for arranging the light-emitting elements 30 as illustrated in FIG. 1. The second base part 20 has an elongate shape in the top view of FIG. 1, and a cross-sectional shape fitted to the cross section of the groove 11 as illustrated in FIG. 2. In addition, as illustrated in FIG. 2, the multiple (ten in this example) light-emitting elements 30 are mounted on the upper surface of the second base part 20. Further, the first resin sealing cover 70 is formed on the upper surface of the second base part 20 to have a convex cross-sectional shape and cover the light-emitting elements 30. The second base part 20 is arranged in the groove 11 in the first base part 10, and is resin bonded to the first base part 10 with bonding resin as illustrated in FIG. 2.

As illustrated in FIGS. 1 and 2, the second base part 20 is formed to have a thickness corresponding to the depth of the groove 11 and such a width that the second base part 20 can be fitted in the groove 11 in the first base part 10. Therefore, there is no difference in level between the upper surface of the second base part 20 and the upper surfaces of the first and second elongate portions 13 and 14 when the second base part 20 is fitted in the groove 11. The second base part 20 may be formed of, for example, glass epoxy resin or ceramic material.

Further, terminal electrodes for connection to an external power supply can be arranged on the base 100 (constituted by the first and second base parts 10 and 20) as needed. In the case where an anode electrode and a cathode electrode are arranged on opposite outer side surfaces (the outer side surfaces of the base 100 opposed in the width direction or the outer side surfaces of the base 100 opposed in the length direction), and the base 100 is provided in plurality, the plurality of bases can be easily connected. Alternatively, both of the anode electrode and the cathode electrode may be arranged on one of the opposed outer side surfaces of the base 100.

The light-emitting elements 30 emit light when voltage is applied to the light-emitting elements 30, and excites a fluorescent material when necessary. As illustrated in FIG. 1, the multiple (ten in this example) light-emitting elements 30 are arranged on the second base part 20, and are electrically connected by ones of wires W to the conductive-wiring parts 40, which are discretely formed on the first and second elongate portions 13 and 14. At this time, each of the light-emitting elements 30 is connected by one of the wires W to a nearest one, on each of the first and second elongate portions 13 and 14, of the conductive-wiring parts 40 as illustrated in FIG. 1. Further, the light-emitting elements 30 are electrically connected by connecting ones of the conductive-wiring parts 40 on each of the first and second elongate portions 13 and 14 to which the light-emitting elements 30 are connected. A concrete method for connecting the light-emitting elements 30 according to the present embodiment will be explained later.

Specifically, the light-emitting elements 30 are LED chips. The wavelengths of the LED chips can be arbitrarily selected according to the application. For example, the light-emitting elements 30 may be formed of nitride-based semiconductors having compositions $In_XAl_YGa_{1-X-Y}$ ($0 \leq X$, $0 \leq Y$, $X+Y \leq 1$) for blue light (having the wavelengths of 430 to 490 nm) and green light (having the wavelengths of 490 to 570 nm). In addition, as illustrated in FIG. 1, the light-emitting elements 30 used in this example are the face-up mount type. As illustrated in FIG. 2, the upper and side surfaces of the light-emitting elements 30 are covered by the first resin sealing cover 70.

The conductive-wiring parts 40 are provided to relay electrical connection between the light-emitting elements 30. As illustrated in FIG. 1, the conductive-wiring parts 40 are arranged on both of the edge portions, in the width direction, of the first base part 10, i.e., on the upper surfaces of the first and second elongate portions 13 and 14, which are located on both sides of the array of the light-emitting elements 30. Specifically, the conductive-wiring parts 40 are discretely formed along the length direction on the first and second elongate portions 13 and 14. Therefore, in the light-emitting device 1, in whatever position on the second base part 20 each of the light-emitting elements 30 is placed, the light-emitting elements 30 can be easily connected to the conductive-wiring parts 40.

As illustrated in FIG. 1, each of the conductive-wiring parts 40 has a rectangular shape, and the conductive-wiring parts 40 are discretely formed on each of the first and second elongate portions 13 and 14 like a dashed line. However, the shapes of the conductive-wiring parts 40 are not limited to the rectangular shapes. For example, each of the conductive-wiring parts 40 may have a round shape and the conductive-wiring parts 40 may be discretely formed on each of the first and second elongate portions 13 and 14 like a dotted line. Further, the thicknesses of the conductive-wiring parts 40 and the intervals between the conductive-wiring parts 40 are not specifically limited. However, decrease in the intervals between the conductive-wiring parts 40 increases the number of the conductive-wiring parts arranged per light-emitting element, and enhances the degree of freedom in layout of the light-emitting elements 30. Therefore, it is preferable that the conductive-wiring parts 40 be formed on each of the first and second elongate portions 13 and 14 at the minimum possible intervals at which no short circuit occurs.

Specifically, it is preferable that the number of the conductive-wiring parts arranged per light-emitting element on the upper surface of each of the first and second elongate portions 13 and 14 (i.e., on each of one and the other sides of the array of the light-emitting elements 30) be two or more, for example, as illustrated in FIG. 1. In the example illustrated in FIG. 1, two or three conductive-wiring parts per light-emitting element are arranged on each side, in the width direction of the base 100, of the array of the light-emitting elements 30. Therefore, in the light-emitting device 1, the light-emitting elements 30 are electrically connected through ones of the conductive-wiring parts 40 in a desired manner (e.g., a series connection, a parallel connection, or a series-parallel connection).

The above condition that "the number of the conductive-wiring parts arranged per light-emitting element on each side, in the width direction of the base 100, of the array of the light-emitting elements 30 be two or more" can be more specifically defined as a condition that two or more conductive-wiring parts are contained between two adjacent virtual lines in the case where a virtual line perpendicular to the length direction of the light-emitting device 1 is defined to pass through the midpoint between the opposed edges of each pair of adjacent ones of the conductive-wiring parts 40. Alternatively, the above condition can also be defined as a condition that in the case where the nearest light-emitting element from each of the conductive-wiring parts 40 is determined, each of the light-emitting elements 30 is the nearest light-emitting element from two or more conductive-wiring parts.

Each of the light-emitting elements 30 has a pair of electrodes (not shown) Each electrode of each light-emitting element is electrically connected by one of the wires W to one of the conductive-wiring parts 40 on one side (in the width direction of the base 100) of the array of the light-emitting elements 30. In addition, ones of the conductive-wiring parts 40 on each side are connected to each other by ones of the wires W, as illustrated in FIG. 1. In addition, the upper and side surfaces of the conductive-wiring parts 40 are covered by the optically-reflective resin covers 50 as illustrated in FIG. 2. The conductive-wiring parts 40 may be a metal film of, for example, copper, silver, gold, aluminum, or the like.

The optically-reflective resin covers 50 are provided for reflecting the light emitted from the light-emitting elements 30. As illustrated in FIG. 2, the optically-reflective resin covers 50 are respectively formed on the upper surfaces of the first and second elongate portions 13 and 14, and each have a convex cross-sectional shape so as to cover the conductive-wiring parts 40 and part of the ones of the wires W extending from the ones of the conductive-wiring parts 40 toward the light-emitting elements 30. Further, although not shown, the optically-reflective resin covers 50 are formed continuously in the length direction of the first base part 10 on the upper surfaces of the first and second elongate portions 13 and 14, respectively, so as to cover all the conductive-wiring parts 40 (although the conductive-wiring parts 40 are discretely formed on the upper surfaces of the first and second elongate portions 13 and 14).

The widths and the thicknesses of the optically-reflective resin covers 50 are not specifically limited, and the optically-reflective resin covers 50 can be formed to have arbitrary widths and thicknesses according to desired reflection characteristics. For example, it is preferable that the optically-reflective resin covers 50 be formed to have a height exceeding the height of the light-emitting elements 30 in order to reflect the light laterally emitted outward from the light-emitting elements 30. In addition, it is also preferable that the optically-reflective resin covers 50 be formed of an insulating material. Specifically, in order to secure predetermined strength, the optically-reflective resin covers 50 is preferably formed of, for example, a thermosetting resin, a thermoplastic resin, or the like. For example, the optically-reflective resin covers 50 may be formed of epoxy resin, silicone resin, modified silicone, urethane resin, oxetane resin, fluororesin, acrylic resin, polycarbonate, polyimide, polyphthalamide containing $TiO_2$, $ZrO_2$, $Al_2O_3$, $SiO_2$, or the like.

The first resin sealing cover 70 is arranged for protecting the parts arranged on the second base part 20 from dust, water, external force, and the like. As illustrated in FIG. 2, the first resin sealing cover 70 is formed on the second base part 20 to have a convex cross-sectional shape so as to cover the light-emitting elements 30, part of the ones of the wires W extending from the light-emitting elements 30 toward the ones of the conductive-wiring parts 40, and part of the second base part 20. Further, although not shown, the first resin sealing cover 70 is formed continuously in the length direction of the first base part 10 on the upper surfaces of the second base part 20 so as to cover all the light-emitting elements 30 formed on the second base part 20.

The width and the thickness of the first resin sealing cover 70 are not specifically limited, and the first resin sealing cover 70 can be formed to have an arbitrary width and thickness. In order to efficiently output the light emitted from the light-emitting elements 30, it is preferable that the first resin sealing cover 70 be formed of a transparent material such as silicone resin or epoxy resin. In addition, the first resin sealing cover 70 may contain a fluorescent material (not shown). The fluorescent material may be dispersed in the first resin sealing cover 70, or sedimented at and fixed to the upper surface or a side surface of the light-emitting elements 30.

Similar to the first resin sealing cover 70, the second resin sealing cover 80 is arranged for protecting the parts arranged on the second base part 20 from dust, water, external force, and the like. As illustrated in FIG. 2, the second resin sealing cover 80 is formed over a width from the first elongate portion 13 to the second elongate portion 14 to have a convex cross-sectional shape so as to cover the first resin sealing cover 70, part of the second base part 20, part of the wires W, part of the first and second elongate portions 13 and 14, and part of the optically-reflective resin covers 50. The second resin sealing cover 80. Further, although not shown, the second resin sealing cover 80 is formed continuously in the length direction of the first base part 10, over the width from the first elongate portion 13 to the second elongate portion 14, so as to cover the entire first resin sealing cover 70.

The width and the thickness of the second resin sealing cover 80 are not specifically limited, and the second resin sealing cover 80 can be formed to have an arbitrary width and thickness. In order to efficiently output the light emitted from the light-emitting elements 30, it is preferable that the second resin sealing cover 80 be formed of a transparent material such as silicone resin or epoxy resin.

2. Manners of Connection in Light-Emitting Device

Hereinbelow, some concrete manners of connections of the light-emitting elements 30 according to the present embodiment are explained.

2.1 Series Connection

The light-emitting elements 30 may be connected in series, for example, as illustrated in FIG. 1. As illustrated in FIG. 1, each electrode (having a polarity) in the aforementioned pair (not shown) in each of the light-emitting elements 30 is connected by one of the wires W to one of the conductive-wiring parts 40 arranged on one side of the array of the light-emitting elements 30. The one of the conductive-wiring parts 40 located on the one side of the array of the light-emitting elements 30 and connected to each electrode of each of the light-emitting elements 30 is connected, by ones of the wires W, through one or more of the conductive-wiring parts 40 arranged on the same side of the array of the light-emitting elements 30 to another of the conductive-wiring parts 40 connected to an electrode, having the opposite polarity, of an adjacent one of the light-emitting elements 30.

For example, the one of the conductive-wiring parts 40 located on the first elongate portion 13 and connected to the rightmost one of the light-emitting elements 30 in FIG. 1 is connected through one of the conductive-wiring parts 40 (on the first elongate portion 13) to the second left adjacent one from the rightmost one (on the first elongate portion 13) of the conductive-wiring parts 40, by ones of the wires W. In addition, the one of the conductive-wiring parts 40 located on the first elongate portion 13 and connected to the fifth one of the light-emitting elements 30 from the right in FIG. 1 is connected through two of the conductive-wiring parts 40 (on the first elongate portion 13) to the third left adjacent one from the fifth one of the conductive-wiring parts 40 (on the first elongate portion 13), by ones of the wires W. In this way, as illustrated in FIG. 1, the ten light-emitting elements 30 are connected in series. Further, the light-emitting elements 30 can be connected in series by alternately arranging the positive and negative electrodes of the light-emitting elements 30 between the first and second elongate portions 13 and 14 as illustrated in FIG. 1. (In FIG. 1, the positive electrodes are indicated by "+".)

2.2 Parallel Connection

Figure 3:
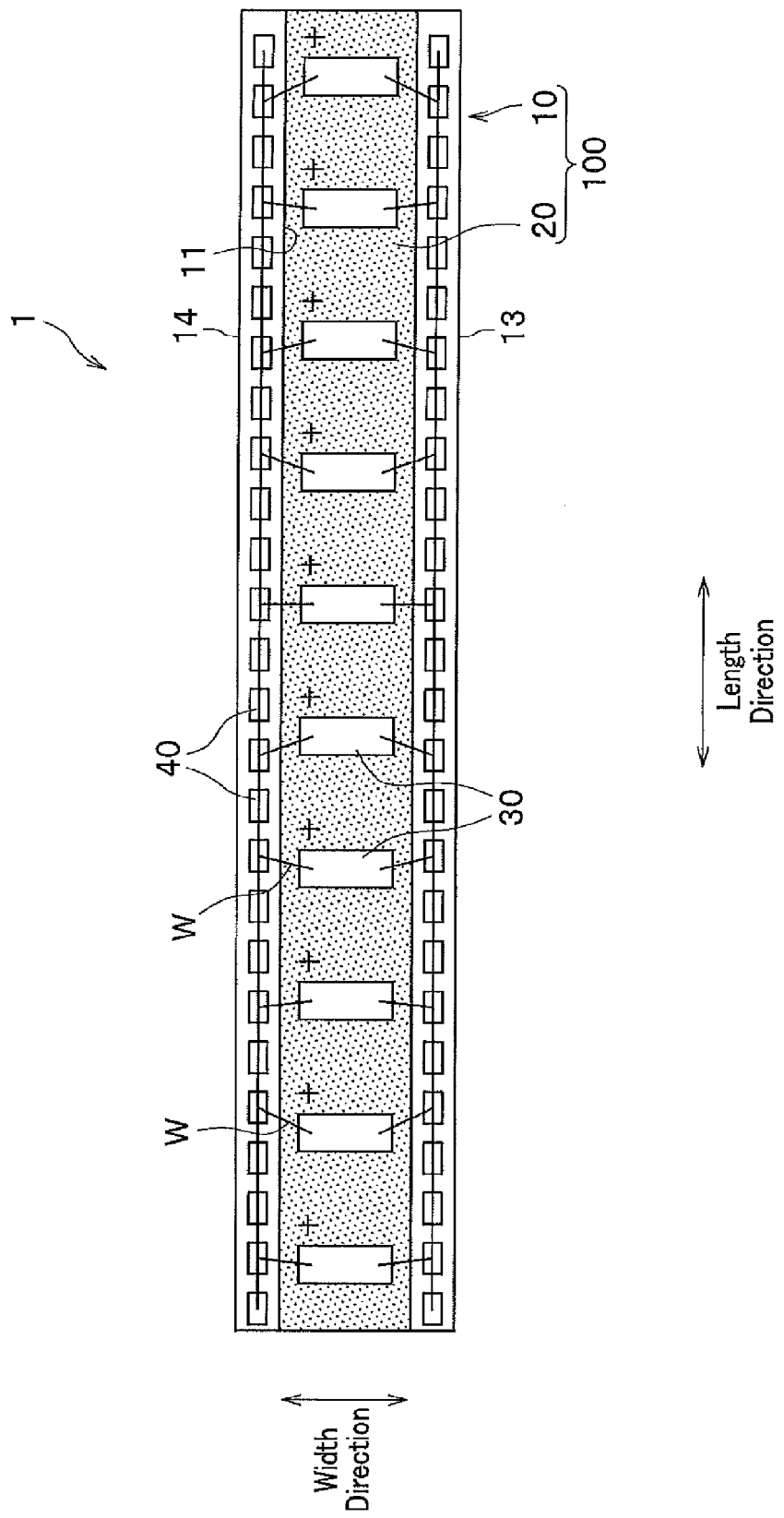
FIG. 3 is a top view schematically illustrating the entire structure of the light-emitting device according to the embodiment of the present invention (except for the resin members) in the case where light-emitting elements are connected in parallel.

Alternatively, the light-emitting elements 30 may be connected in parallel, for example, as illustrated in FIG. 3. That is, the pair of electrodes (not shown) of each of the light-emitting elements 30 are respectively connected by ones of the wires W to ones of the conductive-wiring parts 40 arranged on the both sides of the array of the light-emitting elements 30. In addition, the one of the conductive-wiring parts 40 connected to each electrode of each of the light-emitting elements 30 is connected, by ones of the wires W, through one or more of the conductive-wiring parts 40 located on the same side in the width direction to one of the conductive-wiring parts 40 connected to an electrode, having the same polarity, of an adjacent one of the light-emitting elements 30.

For example, the one of the conductive-wiring parts 40 connected to the rightmost one of the light-emitting elements 30 in the arrangement illustrated in FIG. 3 is connected by ones of the wires W through one of the conductive-wiring parts 40 to the second left adjacent one of the conductive-wiring parts 40. In addition, the one of the conductive-wiring parts 40 connected to the fifth one, from the rightmost one, of the right-emitting elements 30 in the arrangement illustrated in FIG. 3 is connected by ones of the wires W through two of the conductive-wiring parts 40 to the third left adjacent one of the conductive-wiring parts 40. In this way, as illustrated in FIG. 3, the ten light-emitting elements 30 are connected in parallel. Further, the light-emitting elements 30 can be connected in parallel by arranging the light-emitting elements 30 between the first and second elongate portions 13 and 14 in such a manner that the positive electrodes of the light-emitting elements 30 (which are indicated by "+" in FIG. 3) are aligned on one side in the width direction of the base 100, and the negative electrodes of the light-emitting elements 30 are aligned on the other side in the width direction.

2.3 Series-Parallel Connection

Figure 4:
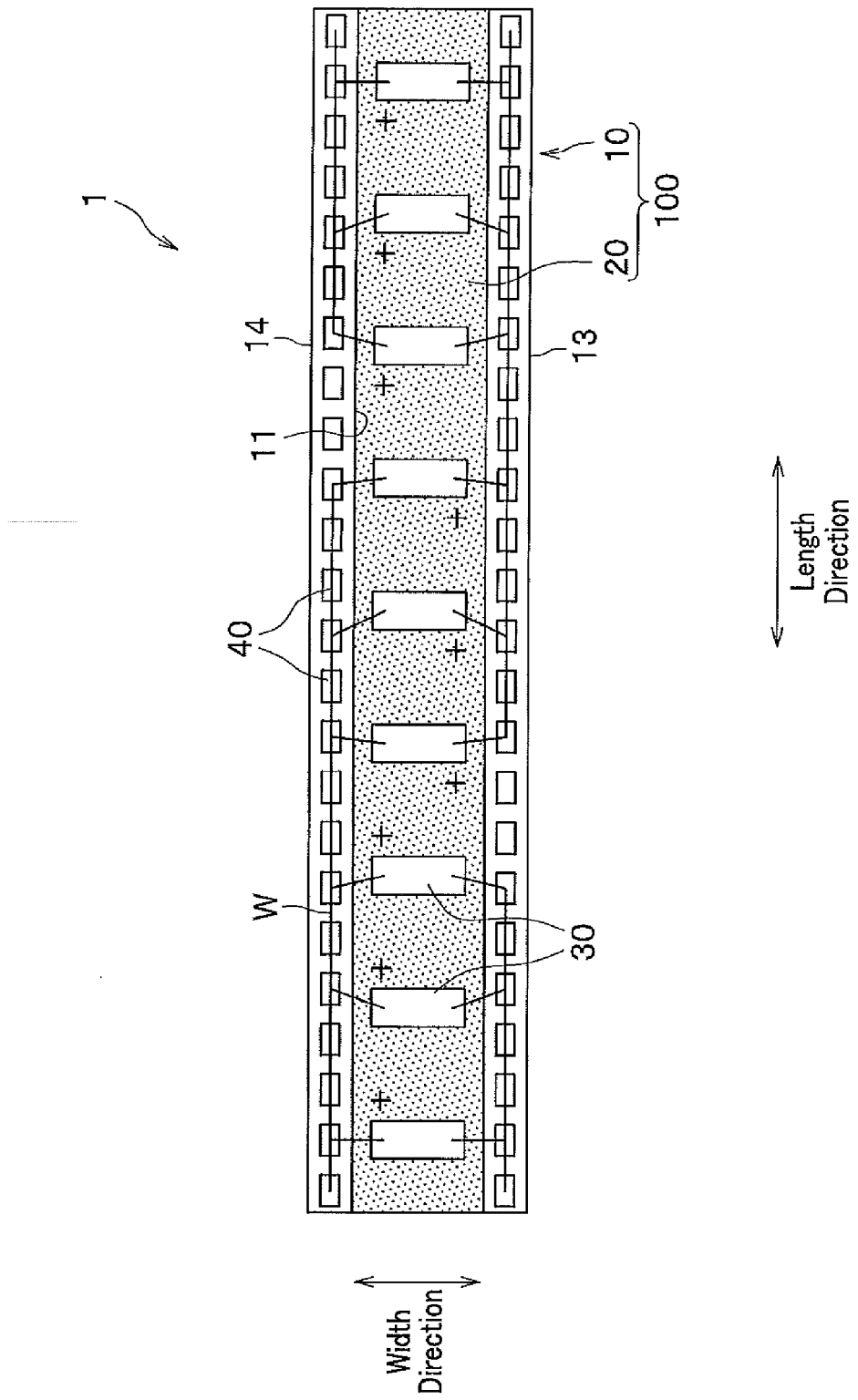
FIG. 4 is a top view schematically illustrating the entire structure of the light-emitting device according to the embodiment of the present invention (except for the resin members) in the case where light-emitting elements are connected in a series-parallel connection.

Further alternatively, the light-emitting elements 30 may be connected in a series-parallel connection, for example, as illustrated in FIG. 4. In the arrangement of FIG. 4, the pair of electrodes (not shown) of each of the light-emitting elements 30 are respectively connected by ones of the wires W to ones of the conductive-wiring parts 40 arranged on both sides of the array of the light-emitting elements 30. Further, some of the conductive-wiring parts 40 connected to each electrode of each light-emitting element is connected, by ones of the wires W, through one or more of the conductive-wiring parts 40 located on the same side in the width direction of the base 100 to one of the conductive-wiring parts 40 connected to an electrode, having the same polarity, of an adjacent light-emitting element.

Ones of the conductive-wiring parts 40 in each light-emitting element group in the example of FIG. 4 are connected as follows. For example, the one of the conductive-wiring parts 40 connected to the rightmost one of the light-emitting elements 30 in the arrangement illustrated in FIG. 4 is connected by ones of the wires W through two of the conductive-wiring parts 40 to the third left adjacent one of the conductive-wiring parts 40. In addition, the one of the conductive-wiring parts 40 connected to the fifth one, from the right, of the light-emitting elements 30 in the arrangement illustrated in FIG. 4 is connected by ones of the wires W through one of the conductive-wiring parts 40 to the second left adjacent one of the conductive-wiring parts 40. Hereinafter, a group constituted by consecutive ones of the light-emitting elements 30 connected in parallel is referred to as a light-emitting element group.

In addition, adjacent light-emitting element groups are connected in series through one or more of the conductive-wiring parts 40 as illustrated in FIG. 4. Specifically, the negative electrode of the rearmost one (leftmost one) of the light-emitting elements in the rightmost one of the light-emitting element groups (i.e., the third one from the rightmost light-emitting element in the array of the light-emitting elements 30 in FIG. 4) is connected by ones of the wires W through two of the conductive-wiring parts 40 to the positive electrode of the leading one (rightmost one) of the light-emitting elements in the middle one of the light-emitting element groups (i.e., the fourth one from the rightmost light-emitting element in the array of the light-emitting elements 30 in FIG. 4). In addition, the negative electrode of the rearmost one (leftmost one) of the light-emitting elements in the middle one of the light-emitting element groups (i.e., the sixth one from the rightmost light-emitting element in the array of the light-emitting elements 30 in FIG. 4) is connected by ones of the wires W through two of the conductive-wiring parts 40 to the positive electrode of the leading one (rightmost one) of the light-emitting elements in the leftmost one of the light-emitting element groups (i.e., the seventh one from the rightmost light-emitting element in the array of the light-emitting elements 30 in FIG. 4). In this way, as illustrated in FIG. 4, the three light-emitting elements in each of the three light-emitting element groups are connected in parallel, and the three light-emitting element groups are connected in series. As illustrated in FIG. 4, in each light-emitting element group, the positive electrodes (indicated by "+" in FIG. 4) of the light-emitting elements are aligned on one side of the array of the light-emitting elements 30, and the negative electrodes of the light-emitting elements are aligned on the other side of the array of the light-emitting elements 30, for realizing the parallel connection of the light-emitting elements. In addition, the side on which the positive electrodes are aligned is changed between adjacent ones of the light-emitting element groups for realizing the series connection of the light-emitting element groups.

2.4 Advantages of Light-Emitting Device in Connection

As explained above, the multiple light-emitting elements 30 can be easily connected in either of the series connection, the parallel connection, and the series-parallel connection by using the conductive-wiring parts 40 arranged on both sides of the array of the light-emitting elements 30.

In the light-emitting device 1 having the structure explained above, the conductive-wiring parts 40 are discretely formed on both sides of the array of the light-emitting elements 30, and the number of conductive-wiring parts per light-emitting element on each side of the array of the light-emitting elements 30 is two or more. Therefore, when the light-emitting elements 30 are arranged on the base 100, two or more of the conductive-wiring parts 40 can exist between each pair of adjacent ones of the light-emitting elements 30, and the two or more of the conductive-wiring parts 40 can be freely used for connection between the light-emitting elements. Thus, by using the conductive-wiring parts 40 discretely formed on the base 100 along the length direction, the light-emitting elements 30 arrayed on the base 100 along the length direction can be connected in a desired manner (e.g., a series connection, a parallel connection, and a series-parallel connection), and the manner of connection of the light-emitting elements 30 can be freely changed. Consequently, the versatility of the light-emitting device 1 is improved by the above arrangement of the conductive-wiring parts 40.

In addition, the base 100 is constituted by the two regions, the region on which the light-emitting elements 30 are arranged and the other region. Therefore, it is possible to form each of the above regions of an optimum material. For example, the second base part 20, on which the light-emitting elements 30 are arranged, can be formed of a material which is superior in heat dissipation, and the first base part 10 can be formed of a low-cost material.

Specifically, the cost of the light-emitting device 1 can be suppressed in the case where at least one of the first base part 10 and the second base part 20 is formed of glass epoxy resin, compared with the case where both of the first base part 10 and the second base part 20 are formed of ceramic material. Further, the heat dissipation, heat resistance, optical resistance, and optical reflectivity of the light-emitting device 1 can be improved in the case where the first base part 10 is formed of aluminum and the second base part 20 is formed of ceramic material, compared with the case where the first base part 10 is formed of glass epoxy resin.

3. Process for Manufacturing Light-Emitting Device

Hereinbelow, a process for manufacturing the light-emitting device 1 according to the embodiment of the present invention is explained with reference to FIG. 5 (and FIGS. 1 and 2 when necessary). The process explained below includes a step of forming the first base part, a step of forming the conductive-wiring parts, a step of arranging the second base part, a step of mounting light-emitting elements, a step of bonding wires, a step of forming optically-reflective resin parts, a step of forming the first resin sealing cover, and a step of forming the second resin sealing cover.

Figure 5A:
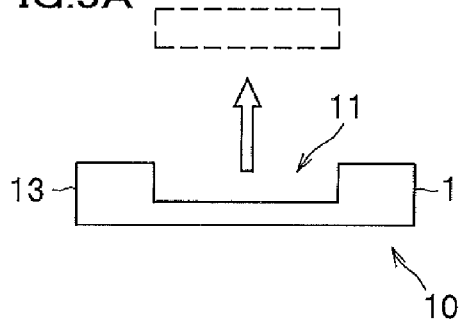
FIGS. 5A to 5H are cross-sectional views schematically illustrating the operations in respective steps in a process for manufacturing the light-emitting device according to the embodiment of the present invention, where

In the step of forming the first base part, the groove 11 is formed in a base material by removing a portion of the base material as illustrated in FIG. 5A. Thus, the first base part 10 having the 11 is formed. The base material (before the formation of the groove 11) may be a lamination of a predetermined number of thin platelike members of glass epoxy resin, aluminum, and the like. Alternatively, the first base part 10 may be formed by laminating two or more platelike members and adhering to the lamination a further platelike member having a through hole corresponding to the groove 11. Further alternatively, the first base part 10 may be formed by laminating two or more platelike members and adhering further platelike members corresponding to the first and second elongate portions 13 and 14 to areas of the lamination near both edges in the width direction.

Figure 5B:
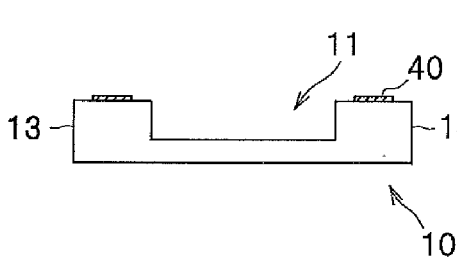

In the step of forming the conductive-wiring parts, the conductive-wiring parts 40 are formed on the first base part 10. In this step, the conductive-wiring parts 40 are realized by a film of a metal such as copper which is formed on the upper surface of each of the first and second elongate portions 13 and 14 by plating or evaporation as illustrated in FIG. 5B.

Figure 5C:
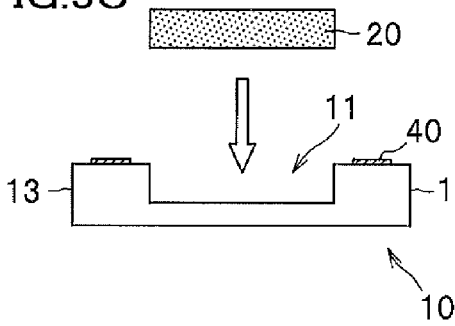

In the step of arranging the second base part, the second base part 20 is mounted on the first base part 10. As illustrated in FIG. 5C, the second base part 20 is arranged in the groove 11 in the first base part 10.

Figure 5D:
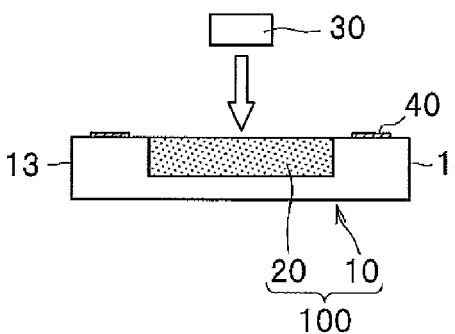

In the step of mounting light-emitting elements, the light-emitting elements 30 are mounted on the upper surface of the second base part 20 as illustrated in FIG. 5D. Alternatively, it is possible to mount the light-emitting elements 30 on the upper surface of the second base part 20 in advance of the step of arranging the second base part, and mount on the first base part 10 the second base part 20 on which the light-emitting elements 30 are already mounted, in the step of arranging the second base part.

Figure 5E:
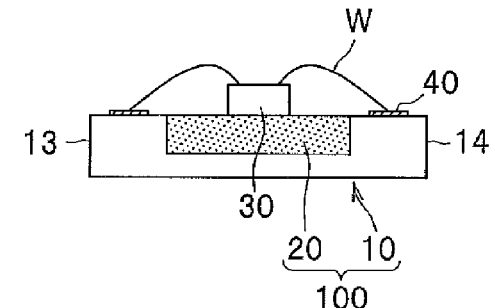

In the step of bonding wires, the light-emitting elements 30 are connected to the conductive-wiring parts 40 by ones of the wires W. In this step, as illustrated in FIG. 5E, the pair of electrodes (not shown) of each of the light-emitting elements 30 are electrically connected to ones of the conductive-wiring parts 40. In addition, although not shown in FIG. 5E, in the step of bonding wires, ones of the conductive-wiring parts 40 are also connected to each other by ones of the wires W according to the manner of connection (e.g., a series connection, a parallel connection, or a series-parallel connection). The wires W are made of gold, silver, copper, platinum, aluminum, or an alloy of these metal elements.

Figure 5F:
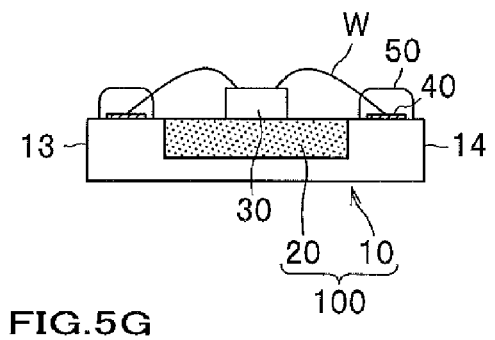

In the step of forming optically-reflective resin parts, the optically-reflective resin covers 50 are formed on the first base part 10. In this step, a resin applicator (not shown) which drops a resin material for the optically-reflective resin covers 50 is used. The resin applicator is operated along the length direction of the first base part 10 in such a manner that the optically-reflective resin covers 50 are respectively formed on the upper surfaces of the first and second elongate portions 13 and 14 to cover the conductive-wiring parts 40 and part of the ones of the wires W extending from ones of the conductive-wiring parts 40 toward the light-emitting elements 30 as illustrated in FIG. 5F.

Figure 5G:
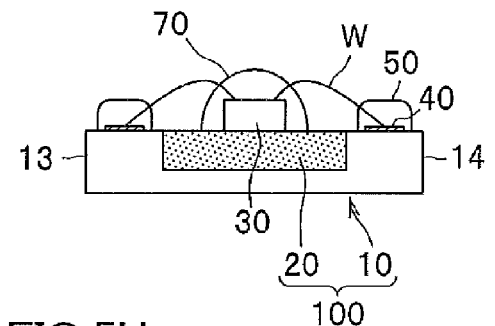

In the step of forming the first resin sealing cover, the first resin sealing cover 70 is formed on the second base part 20. In this step, a resin applicator (not shown) which drops a resin material for the first resin sealing cover 70 is used. This resin applicator is operated along the length direction of the first base part 10 in such a manner that the first resin sealing cover 70 is formed on the upper surface of the second base part 20 to cover the light-emitting elements 30 and part of the ones of the wires W extending from ones of the light-emitting elements 30 toward the conductive-wiring parts 40 as illustrated in FIG. 5G.

Figure 5H:
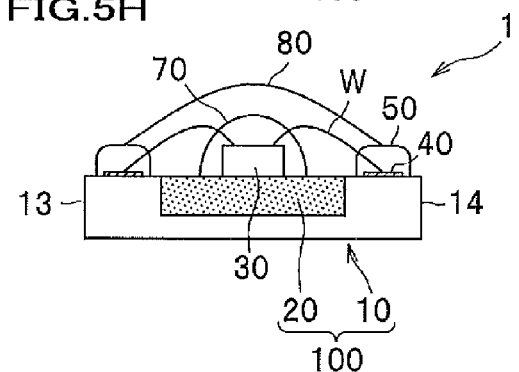

In the step of forming the second resin sealing cover, the second resin sealing cover 80 is formed over the base 100. In this step, a resin applicator (not shown) which drops a resin material for the second resin sealing cover 80 is used. This resin applicator is operated along the length direction of the first base part 10 in such a manner that the second resin sealing cover 80 is formed over the width from the first elongate portion 13 to the second elongate portion 14 to cover the first resin sealing cover 70, part of the second base part 20, part of the wires W, part of the first and second elongate portions 13 and 14, and part of the optically-reflective resin covers 50 as illustrated in FIG. 5H.

Thus, the light-emitting device 1 as illustrated in FIGS. 1 and 2 can be manufactured through the above steps.

4. Variations of Embodiment

Although the light-emitting device according to the present invention is explained in detail by using the embodiment as above, the scope of the present invention is not limited to the explained embodiment, and should be broadly construed on the basis of the description in the appended claims. In addition, the present invention can be variously modified and changed on the basis of the descriptions in the present specification and the appended claims, and such modifications and changes are also included in the scope of the present invention. Hereinbelow, light-emitting devices as variations of the described embodiment of the present invention are explained.

4.1 First Variation

In the light-emitting device 1 according to the explained embodiment, the bottom portion 12 and the first and second elongate portions 13 and 14 are integrally formed of the identical material as illustrated in FIG. 2. However, the bottom portion 12 may be formed of a material different from the material constituting the first and second elongate portions 13 and 14.

Figure 6:
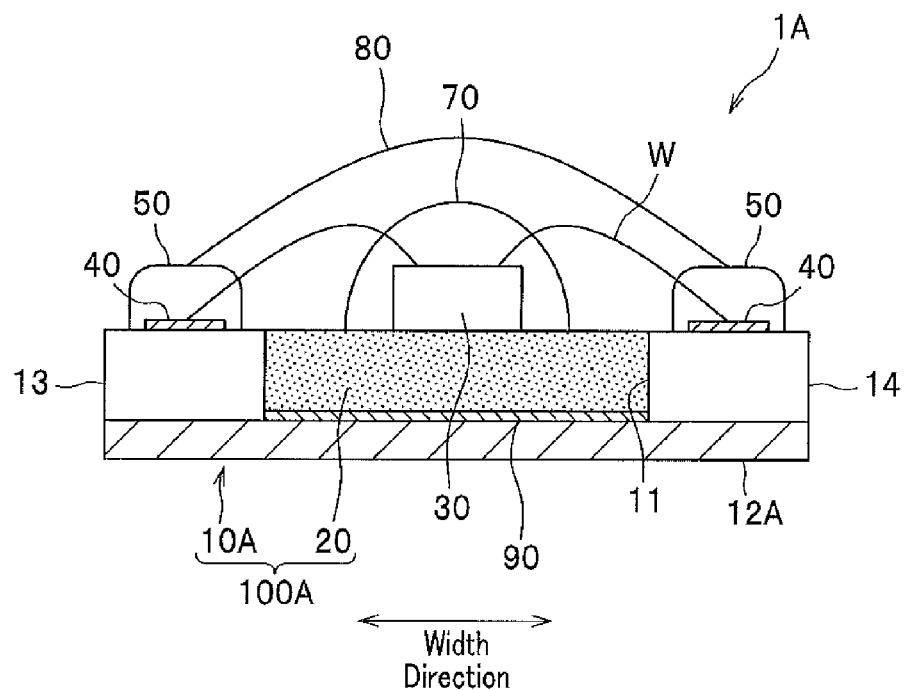
FIG. 6 is a cross-sectional view schematically illustrating the entire structure of a first variation of the light-emitting device according to the embodiment of the present invention at the A-A cross section in FIG. 1.

Specifically, in the light-emitting device 1A as the first variation of the embodiment illustrated in FIG. 6, the bottom portion 12A of the first base part 10A is realized by copper foil, the first and second elongate portions 13 and 14 of the first base part 10A are formed of glass epoxy resin, and the second base part 20 is formed of ceramic material. In addition, as illustrated in FIG. 6, the upper surface of the bottom portion 12A realizes the bottom surface of the groove 11, and the first and second elongate portions 13 and 14 are arranged apart from each other on the copper foil realizing the bottom portion 12A. The inner side surfaces of the first and second elongate portions 13 and 14 which are opposed to each other realize the side wall surfaces of the groove 11.

Further, in the light-emitting device 1A, a metal film 90 of gold, silver, or the like is formed between the bottom portion 12A and the second base part 20 as illustrated in FIG. 6, so that the bottom surface of the second base part 20 (of the ceramic material) and the upper surface of the bottom portion 12A (of the copper foil) are bonded through the metal film 90. From the viewpoint of heat dissipation, it is preferable that the metal film 90 be formed over the entire interface between the second base part 20 and the bottom portion 12A. However, the metal film 90 may be formed in a part of the interface between the second base part 20 and the bottom portion 12A. For example, eutectic bonding or the like can be used for bonding the second base part 20 and the bottom portion 12A through the metal film 90.

In the light-emitting device 1A having the above structure, the second base part 20 is formed of the ceramic material, and the bottom of the groove 11 is formed of the copper foil. Therefore, the heat generated by the light-emitting elements 30 can be transferred through the second base part 20 (of the ceramic material) and the bottom of the groove 11 (of the copper foil), and be externally dissipated. Thus, the performance in heat dissipation can be improved. In addition, since the metal film 90 is arranged between the second base part 20 (of the ceramic material) and the bottom portion 12A (of the copper foil), the bonding of the identical type of materials can improve the adhesiveness between the ceramic material constituting the second base part 20 and the copper foil realizing the bottom portion of the groove 11, and further improve the performance in heat dissipation.

4.2 Second Variation

In the light-emitting device 1 according to the explained embodiment, the base 100 is constituted by the first base part 10 and the second base part 20. However, the first base part 10 and the second base part 20 may be integrally formed as in the second variation of the embodiment illustrated in FIG. 7.

Figure 7:
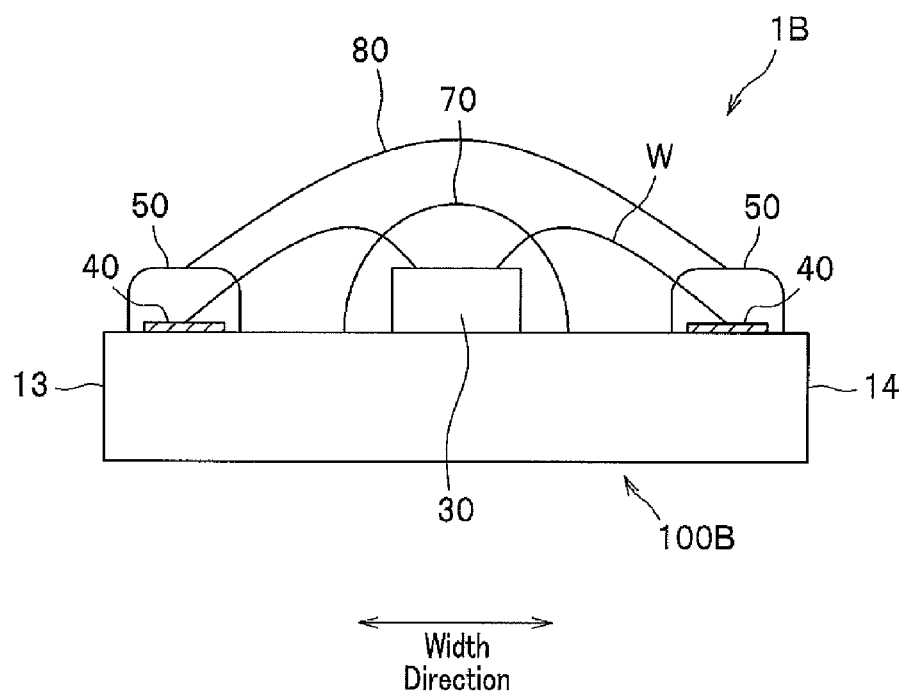
FIG. 7 is a cross-sectional view schematically illustrating the entire structure of a second variation of the light-emitting device according to the embodiment of the present invention at the A-A cross section in FIG. 1.

Specifically, in the light-emitting device 1B as the second variation of the embodiment illustrated in FIG. 7, the base 100B is not constituted by multiple parts, and is integrally formed of a single material. The step of forming the first base part (illustrated in FIG. 5A) and the step of arranging the second base part (illustrated in FIG. 5C) are unnecessary in the process for manufacturing the light-emitting device 1B having the above base 100B, so that the manufacturing process can be simplified. The base 100B may be, for example, a plate formed of glass epoxy resin or ceramic material, a metal plate of aluminum or the like on which an insulating layer is formed, or a flexible board.

4.3 Third Variation

In the explained examples of the light-emitting devices 1, 1A, and 1B illustrated in FIGS. 2, 6, and 7, the light-emitting elements 30 are assumed to be the face-up mount type. However, the light-emitting elements 30 may be the face-down mount type. In this case, for example, a metal wiring film is formed on the second base part 20 or on the base 100B, and the light-emitting elements 30 are face-down mounted on the metal wiring film with the electrodes of the light-emitting elements 30 facing downward. Thereafter, the conductive-wiring parts 40 are connected to the metal wiring film by wires W.

4.4 Fourth Variation

In the case where the light-emitting elements 30 are face-down mounted, the electrodes of the light-emitting elements 30 may be connected to the conductive-wiring parts 40 by using wiring which is arranged inside the base 100, 100A, or 100B. In this case, for example, a metal wiring film is formed on the second base part 20 or on the base 100B, and the wiring is arranged inside the base 100, 100A, or 100B in such a manner that the bottom surfaces of the conductive-wiring parts 40 are connected to the lower surface of the metal wiring film. Thereafter, the light-emitting elements 30 are face-down mounted on the metal wiring film with the electrodes of the light-emitting elements 30 facing downward, so that the light-emitting elements 30 are electrically connected to the conductive-wiring parts 40. Although not shown, ones of the conductive-wiring parts 40 are connected to each other by wires W in a similar manner to the light-emitting device 1, 1A, or 1B.

In the case where the wiring is arranged inside the base 100, 100A, or 100B, the paths of the wiring are not specifically limited. For example, the wiring may be formed in paths extending from the bottom surfaces of the conductive-wiring parts 40 through the side wall surfaces of the groove 11 to the metal wiring film, or in other paths extending from the bottom surfaces of the conductive-wiring parts 40 through the bottom surfaces of the groove 11 to the metal wiring film. In the case where the wiring is arranged inside the base 100, 100A, or 100B, the ones of the wires W connecting the light-emitting elements 30 to the conductive-wiring parts 40 are not exposed. Therefore, it is unnecessary to arrange the second resin sealing cover 80, so that the process for manufacturing the light-emitting device can be simplified.

4.5 Fifth Variation

In the explained examples of the light-emitting devices 1, 1A, and 1B, the first resin sealing cover 70 is continuously formed in the length direction of the first base part 10. Alternatively, the first resin sealing cover 70 may be formed to cover only the light-emitting elements 30. In this case, in the aforementioned step of forming the first resin sealing cover, the resin material for the first resin sealing cover 70 is dropped for each of the light-emitting elements 30 by the resin applicator (not shown) to form a hemispherical part of the first resin sealing cover 70 covering each of the light-emitting elements 30.

4.6 Sixth Variation

In the explained light-emitting device 1, the conductive-wiring parts 40 are formed on the first and second elongate portions 13 and 14. Alternatively, it is possible to use a printed circuit board 120 on which the conductive-wiring parts 40 are formed by patterning, for example, as illustrated in FIG. 8.

Figure 8:
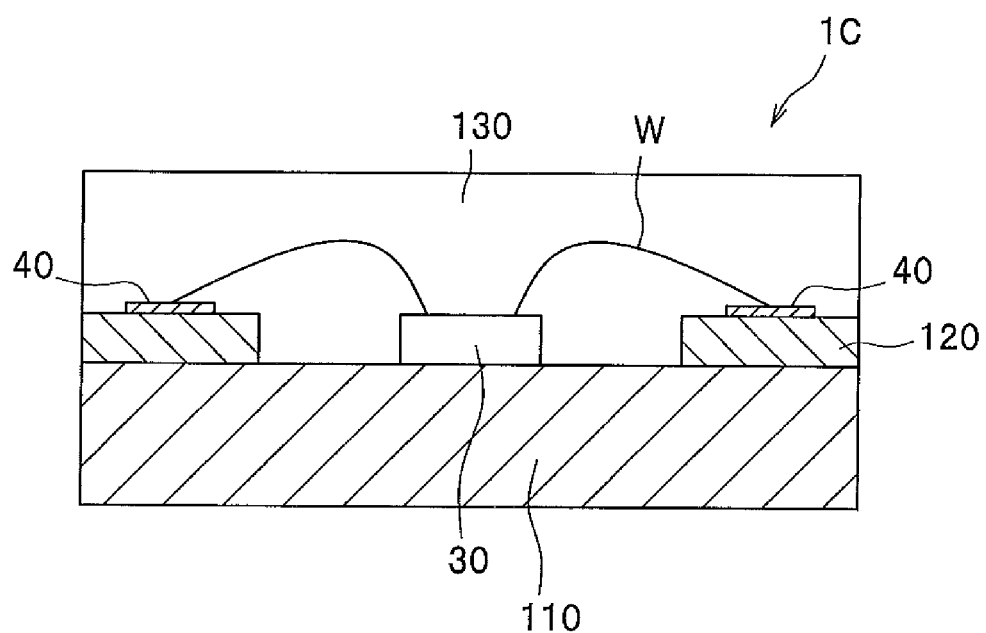
FIG. 8 is a cross-sectional view schematically illustrating the entire structure of a sixth variation of the light-emitting device according to the embodiment of the present invention at the A-A cross section in FIG. 1.

Specifically, in the light-emitting device 1C as the sixth variation of the embodiment, the printed circuit board 120 and the light-emitting elements 30 are arranged on a base 110 as illustrated in FIG. 8. The base 110 is realized by, for example, a metal plate of copper alloy or the like, and the conductive-wiring parts 40 are formed in advance on the printed circuit board 120. The light-emitting elements 30 are connected to the conductive-wiring parts 40 by wires W. In addition, in the light-emitting device 1C, a resin sealing cover 130 having a rectangular cross-sectional shape is formed over the base 110, the printed circuit board 120, and the light-emitting elements 30 as illustrated in FIG. 8. The above structure in which the printed circuit board 120 is formed on the base 110 simplifies the manufacturing process.

What is claimed is:

1. A light-emitting device comprising:
    a base;
    light-emitting elements arranged on the base at intervals in an array on the base; and
    conductive-wiring parts formed on the base so as to be separated from the light-emitting elements;
    wherein the conductive-wiring parts are discretely formed along a direction, and at least two of the conductive-wiring parts are directly connected to each other by at least one wire, each of the conductive-wiring parts relaying electrical connection between the light-emitting elements, and the number of the conductive-wiring parts arranged per light-emitting element is two or more.

2. The light-emitting device according to claim 1,
    wherein the light-emitting elements comprise a first light-emitting element and a second light-emitting element,
    wherein the conductive-wiring parts are disposed on a first side and a second side of the array of the light-emitting elements, wherein the conductive wiring parts include a first conductive-wiring part, a second conductive-wiring part, a third conductive-wiring part,
    wherein the first light-emitting element has a pair of electrodes connected by respective at least one first wire to the first conductive-wiring part formed on the first side of the array of the light-emitting elements and another of the first conductive-wiring part formed on the second side of the array of the light-emitting elements,
    wherein each of the first conductive-wiring parts is respectively connected by respective at least one second wire to the second conductive-wiring part formed on the first side of the array of the light-emitting elements and another of the second conductive-wiring part formed on the second side of the array of the light-emitting elements,
    wherein each of the second conductive-wiring parts is respectively electrically connected by respective at least one third wire to the third conductive-wiring part formed on the first side of the array of the light-emitting elements and another of the third conductive-wiring part formed on the second side of the array of the light-emitting elements, and
    wherein each of the third conductive-wiring parts is respectively connected by respective at least one fourth wire to a pair of electrodes of the second light-emitting element being adjacent to the first light-emitting element.

3. The light-emitting device according to claim 2,
    wherein the pair of the electrodes of the first light-emitting element includes a positive polarity electrode and a negative polarity electrode on its upper surface, the positive polarity electrode on a first side of the first light-emitting element, and the negative polarity electrode on a second side of the first light-emitting element, and wherein the pair of the electrodes of the second light-emitting element has a positive polarity electrode and a negative polarity electrode on its upper surface, the negative polarity electrode on a first side of the second light-emitting element, the and the positive polarity electrode on a second side of the second light-emitting element, and wherein the first light-emitting element and second light-emitting element are connected in series.

4. The light-emitting device according to claim 3,
wherein the positive polarity electrode of the first light-emitting element is electrically connected to the negative polarity electrode of the second light-emitting element, and the negative polarity electrode of the first light-emitting elements is electrically connected respectively to the positive polarity electrode of the second light-emitting element via the first at least one wire, the first conductive-wiring part, the second at least one wire, the second conductive-wiring part, the third at least one wire, the third conductive-wiring part, and the fourth at least one wire.

5. The light-emitting device according to claim 2,
wherein a pair of the electrodes of the first light-emitting element includes a positive polarity electrode and a negative polarity electrode on its upper surface, the positive polarity electrode on a first side of the first light-emitting element, and the negative polarity electrode on a second side of the first light emitting element, and wherein the pair of the electrodes of the second light-emitting element includes a positive polarity electrode and a negative polarity electrode on its upper surface, the positive polarity electrode on a first side of the second light-emitting element, the negative polarity electrode on a second side of the second light-emitting element, and wherein the first light-emitting element and the second light emitting element are connected in parallel.

6. The light-emitting device according to claim 5,
wherein the positive polarity electrodes of the first light emitting element and the positive polarity electrodes of the second light emitting element, and the negative polarity electrodes of the first light-emitting element and the second light emitting element are electrically connected respectively via the first at least one wire, the first conductive-wiring part, the second at least one wire, the second conductive-wiring part, the third at least one wire, the third conductive-wiring part, and the fourth at least one wire.

7. The light-emitting device according to claim 2, wherein the light-emitting elements are grouped into at least two light-emitting element groups,
wherein a first light-emitting element group comprises at least the first light-emitting element and the second light-emitting element connected in parallel through at least the first conductive-wiring part, the second conductive wiring part, and the third conductive-wiring part,
wherein a second light emitting element group comprises at least the first light-emitting element and the second light-emitting element connected in parallel through at least the first conductive-wiring part, the second conductive wiring part, and the third conductive-wiring part, wherein the at least two light-emitting element groups are connected in series to one another.

8. The light-emitting device according to claim 7,
wherein the pair of electrodes of the light emitting elements comprises a positive polarity electrode and a negative polarity electrodes, and
wherein the first light-emitting element group and the second light-emitting element group are connected via the first conductive-wiring part and another of the first conductive-wiring part by the at least one wire so as to connect the two light-emitting element groups in series.

9. The light-emitting device according to claim 2,
wherein the second conductive-wiring part is respectively connected by respective at least one third wire to at least a fourth conductive-wiring part formed on the first side of the array of the light-emitting elements and at least another of the fourth conductive-wiring part formed on the second side of the array of the light-emitting elements, and
each of the fourth conductive-wiring parts is respectively connected by respective at least one fifth wire to the third conductive-wiring part formed on the first side of the array of the light-emitting elements and the another of the third conductive-wiring part formed on the second side of the array of the light-emitting elements, so that the second conductive-wiring part is respectively electrically connected to the third conductive-wiring part.

10. The light-emitting device according to claim 1, wherein the base comprises a first base part and a second base part, the first base part has an elongate shape and a groove formed in a length direction, and the second base part is arranged in the groove,
wherein the light-emitting elements are mounted on an upper surface of the second base part, and
wherein the conductive-wiring parts are placed on the first base part.

11. The light-emitting device according to claim 10, wherein the first base part comprises glass epoxy resin or aluminum, and the second base part comprises glass epoxy resin or ceramic material.

12. The light-emitting device according to claim 10, wherein the groove of the first base part has a bottom surface and side wall surfaces, the bottom surface comprises copper foil, the side wall surfaces of the groove comprise opposed side surfaces of first and second elongate portions of the first base part which are disposed apart from each other on the copper foil, wherein the first and second elongate portions comprise glass epoxy resin, the second base part comprises ceramic material, and the conductive-wiring parts are discretely disposed in an array along the length direction on upper surfaces of the first and second elongate portions.

13. The light-emitting device according to claim 12, wherein the second base part has a bottom surface which is bonded through a metal film to the bottom surface of the groove of the first base part.

14. The light-emitting device according to claim 10, further comprising a first resin sealing cover formed on the upper surface of the second base part to cover the light-emitting elements and part of at least one first wire and at least one fourth wire extending from at least one of the light-emitting elements toward at least one of the conductive-wiring parts.

15. The light-emitting device according to claim 14, further comprising a second resin sealing cover formed in a region between a first side and a second side of the base to cover the first resin sealing cover, part of the at least one first wire and the at least one fourth wire, part of a first elongate portion and a second elongate portions, and part of an optically-reflective resin cover respectively formed on an upper surface of the first side and the second side of the base.

16. The light-emitting device according to claim 1,
wherein the at least one wire connects an electrode of the light-emitting element to one of the conductive-wiring parts, and connect the conductive-wiring parts to each other,
wherein the at least one wire includes one selected from the group consisting of gold, silver, copper, platinum, or aluminum.

17. The light-emitting device according to claim 1, further comprising an optically-reflective resin cover respectively formed on an upper surface of a first side and a second side of the base to cover the conductive-wiring parts and a part of the at least one wire extending from the conductive-wiring parts toward the light-emitting elements.

18. A light-emitting device comprising:
a base;
light-emitting elements arranged on the base at intervals in an array on the base; and
conductive-wiring parts formed on the base;
wherein the conductive-wiring parts are discretely formed along a direction of the base, and at least one of the conductive-wiring parts is directly connected on each side to at least two other conductive-wiring parts by at least one wire, each of the conductive-wiring parts relaying electrical connection between the light-emitting elements, and
wherein the number of the conductive-wiring parts arranged per light-emitting element is two or more.

19. The light-emitting device according to claim 18,
wherein the light-emitting elements comprise a first light-emitting element and a second light-emitting element,
wherein a pair of the electrodes of the first light-emitting element includes a positive polarity electrode and a negative polarity electrode on its upper surface, the positive polarity electrode on a first side of the first light-emitting element, and the negative polarity electrode on a second side of the first light-emitting element, and
wherein a pair of the electrodes of the second light-emitting element has a positive polarity electrode and a negative polarity electrode on its upper surface, the negative polarity electrode on a first side of the second light-emitting element, and the positive polarity electrode on a second side of the second light-emitting element,
wherein the first light-emitting element and the second light-emitting element are connected in series, and
wherein the positive polarity electrode of the first light-emitting element is electrically connected to the negative polarity electrode of the second light-emitting element, and the negative polarity electrode of the first light-emitting elements is electrically connected to the positive polarity electrode of the second light-emitting element respectively via at least one first wire, first conductive-wiring parts, at least one third wire, third conductive-wiring parts, and a at least one fourth wire.

20. The light-emitting device according to claim 18,
wherein the light-emitting elements comprise first light-emitting elements and second light-emitting elements,
wherein a pair of the electrodes of the first light-emitting element includes a positive polarity electrode and a negative polarity electrode on its upper surface, the positive polarity electrode on a first side of the first light-emitting element, and the negative polarity electrode on a second side of the first light emitting element,
wherein a pair of the electrodes of the second light-emitting element includes a positive polarity electrode and a negative polarity electrode on its upper surface, the positive polarity electrode on a first side of the second light-emitting element, the negative polarity electrode on a second side of the second light-emitting element,
wherein the first light-emitting element and the second light emitting element are connected in parallel, and
wherein the positive polarity electrodes of the first light emitting element and the positive polarity electrodes of the second light emitting element, and the negative polarity electrodes of the first light-emitting element and the second light emitting element are electrically connected respectively via at least one first wire, first conductive-wiring parts, at least one second wire, second conductive-wiring parts, at least one third wire, third conductive-wiring parts, and at least one fourth wire.

21. The light-emitting device according to claim 18,
wherein the light-emitting elements comprise a first light-emitting element and a second light-emitting element,
wherein the light-emitting elements are grouped into at least two light-emitting element groups,
wherein a first light emitting element group comprises at least the first light-emitting element and the second light-emitting element connected in parallel through at least a first one of the conductive-wiring parts, a second one of the conductive wiring parts, and a third one of the conductive wiring parts by at least the two wires,
wherein a second light emitting element group comprises at least the first light-emitting element and the second light-emitting element connected in parallel through at least a first one of the conductive-wiring parts, a second one of the conductive wiring parts, and a third one of the conductive wiring parts by at least the two wires,
wherein the at least two light-emitting element groups are connected in series to one another,
wherein a pair of electrodes of the light emitting elements comprises a positive polarity electrode and a negative polarity electrodes, and
wherein the first light-emitting element group and the second light-emitting element group are connected via one of the first conductive-wiring parts and another one of the first conductive-wiring parts by the at least one wire so as to connect the two light-emitting element groups in series.

22. The light-emitting device according to claim 21, wherein the at least one wire includes one selected from the group consisting of gold, silver, copper, platinum, or aluminum.

* * * * *